(12) United States Patent
Miura et al.

(10) Patent No.: US 9,520,564 B2
(45) Date of Patent: Dec. 13, 2016

(54) PHOTOELECTRIC CONVERSION MATERIAL, METHOD FOR PRODUCING THE SAME, AND ORGANIC PHOTOVOLTAIC CELL CONTAINING THE SAME

(71) Applicant: HONDA MOTOR CO., LTD., Minato-Ku, Tokyo (JP)

(72) Inventors: Kazuhiro Miura, Wako (JP); Takahiro Miyazaki, Wako (JP); Tadahiro Shiba, Wako (JP)

(73) Assignee: Honda Motor Co., Ltd., Tokyo (JP)

( * ) Notice: Subject to any disclaimer, the term of this patent is extended or adjusted under 35 U.S.C. 154(b) by 233 days.

(21) Appl. No.: 14/445,332

(22) Filed: Jul. 29, 2014

(65) Prior Publication Data

US 2015/0034880 A1   Feb. 5, 2015

(30) Foreign Application Priority Data

Aug. 2, 2013 (JP) ................. 2013-161851
Aug. 2, 2013 (JP) ................. 2013-161852

(51) Int. Cl.
*H01L 51/00* (2006.01)
*H01L 51/42* (2006.01)
(Continued)

(52) U.S. Cl.
CPC ......... *H01L 51/0035* (2013.01); *C08G 61/10* (2013.01); *C09J 175/04* (2013.01);
(Continued)

(58) Field of Classification Search
CPC ............. C08G 61/10; C08G 2261/312; H01L 51/0047; H01L 51/4253
(Continued)

(56) References Cited

U.S. PATENT DOCUMENTS

| | | | |
|---|---|---|---|
| 9,276,213 B2 * | 3/2016 | Shiba | ............... H01L 51/0035 |
| 2009/0151787 A1 | 6/2009 | Yoshikawa et al. | |
| 2010/0038629 A1 | 2/2010 | Lazarev | |

FOREIGN PATENT DOCUMENTS

| | | |
|---|---|---|
| JP | 2007-019086 A | 1/2007 |
| JP | 2007-273939 A | 10/2007 |

(Continued)

*Primary Examiner* — Shane Fang
(74) *Attorney, Agent, or Firm* — Carrier Blackman & Associates, P.C.; Joseph P. Carrier; Anne G. Sabourin

(57) ABSTRACT

A bulk heterojunction-type organic photovoltaic cell, i.e., BHJ solar cell, has a photoelectric conversion layer containing a mixture of a donor domain and an acceptor domain. The donor domain contains a polymer as a donor (photoelectric conversion material), and the polymer is obtained by reaction of a polyphenylene represented by the following general formula (1). For example, the acceptor domain contains phenyl-$C_{61}$-butyric acid methyl ester (PCBM) as an acceptor. At least one of R1 to R6 in the general formula (1) is an alkoxy group, and R7 to R10 independently represent a hydrogen atom, an alkyl group, or an alkoxy group.

(Continued)

(52) U.S. Cl.
CPC ...... *H01L 51/0043* (2013.01); *H01L 51/4253* (2013.01); *C08G 2101/00* (2013.01); *C08G 2261/12* (2013.01); *C08G 2261/228* (2013.01); *C08G 2261/312* (2013.01); *C08G 2261/3142* (2013.01); *C08G 2261/46* (2013.01); *C08G 2261/91* (2013.01); *H01L 51/0036* (2013.01); *H01L 51/0047* (2013.01); *Y02E 10/549* (2013.01); *Y02P 70/521* (2015.11)

(58) Field of Classification Search
USPC .......................................... 528/125, 373, 370
See application file for complete search history.

(56) References Cited

FOREIGN PATENT DOCUMENTS

| | | | |
|---|---|---|---|
| JP | 4005571 | B2 | 11/2007 |
| JP | 2010-056492 | A | 3/2010 |
| JP | 2010-508677 | A | 3/2010 |

\* cited by examiner

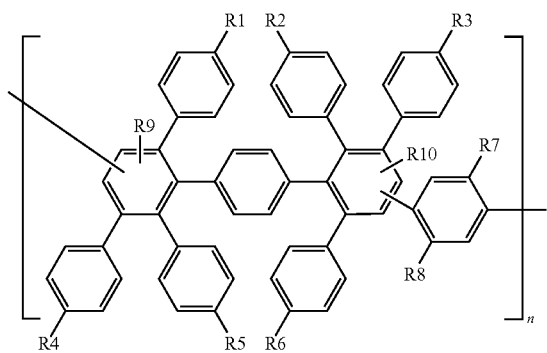

(1)

13 Claims, 11 Drawing Sheets

(51) Int. Cl.
*C08G 61/10* (2006.01)
*C09J 175/04* (2006.01)
*C08G 101/00* (2006.01)

FIG. 8

| DONOR/ACCEPTOR | PHOTOELECTRIC POWER CONVERSION EFFICIENCY [%] | SHORT-CIRCUIT CURRENT Isc [mA/cm²] | OPEN CIRCUIT VOLTAGE Voc [V] | FILL FACTOR FF |
|---|---|---|---|---|
| NANOGRAPHENE POLYMER/ PCBM | 1.3 | 3.27 | 0.80 | 0.5 |

PHOTOELECTRIC CONVERSION MATERIAL, METHOD FOR PRODUCING THE SAME, AND ORGANIC PHOTOVOLTAIC CELL CONTAINING THE SAME

CROSS-REFERENCE TO RELATED APPLICATIONS

This application is based upon and claims the benefit of priority from Japanese Patent Applications No. 2013-161851 filed on Aug. 2, 2013 and No. 2013-161852 filed on Aug. 2, 2013, the contents all of which are incorporated herein by reference.

BACKGROUND OF THE INVENTION

Field of the Invention

The present invention relates to a photoelectric conversion material containing a polymer having a condensed aromatic ring structural unit with a side-chain alkoxy group, a method for producing the photoelectric conversion material, and an organic photovoltaic cell using the photoelectric conversion material.

Description of the Related Art

Organic photovoltaic cells using organic materials, which can be easily produced by a low-cost process such as a roll-to-roll process, have attracted much attention. Such organic photovoltaic cells include bulk heterojunction-type organic photovoltaic cells (hereinafter referred to also as BHJ solar cells).

The BHJ solar cell has a photoelectric conversion layer for converting a light into electricity, and the photoelectric conversion layer contains a mixture of a donor domain and an acceptor domain. The donor domain contains a photoelectric conversion material that acts as an electron donor, and the acceptor domain contains a photoelectric conversion material that acts as an electron acceptor. Specifically, the photoelectric conversion layer is interposed between positive and negative electrodes. When sunlight is introduced through the positive electrode into the photoelectric conversion layer, an exciton is generated in the layer.

The exciton reaches an interface between the donor and acceptor domains, and then is divided into an electron and a hole. The electron is transferred through the acceptor domain to the negative electrode, while the hole is transferred through the donor domain to the positive electrode. The hole and the electron are utilized to generate an electrical energy for energizing an external circuit electrically connected to the negative and positive electrodes.

As described in Japanese Laid-Open Patent Publication No. 2007-273939, typical examples of the photoelectric conversion materials, i.e., the donor and the acceptor, used in the photoelectric conversion layer having the above function include poly(3-hexylthiophene) (P3HT, see FIG. 9) and phenyl-$C_{61}$-butyric acid methyl ester (PCBM, see FIG. 10) respectively.

P3HT and PCBM have energy levels of highest occupied molecular orbital (HOMO) and lowest unoccupied molecular orbital (LUMO) shown in FIG. 11. When the light is introduced into the photoelectric conversion layer as described above, an electron is transited from the HOMO to the LUMO in the P3HT functioning as a donor. Thus, the energy level difference between the HOMO and the LUMO of P3HT corresponds to the bandgap (Eg).

Then, the electron transited to the LUMO of P3HT is transferred to the LUMO of the PCBM functioning as an acceptor, whereby the electron and the hole are generated. Thus, the energy level difference between the LUMO of P3HT and the LUMO of PCBM results in the energy loss, and the energy level difference between the HOMO of P3HT and the LUMO of PCBM corresponds to the open circuit voltage (Voc).

As the photoelectric power conversion efficiency of the solar cell becomes higher, the area required for achieving a desired power generation capacity is reduced. Therefore, advantageously, the weight and the installation area of the solar cell can be reduced, so that the layout of the solar cell can be designed more freely.

The photoelectric power conversion efficiency of the organic photovoltaic cell such as the BHJ solar cell can be increased by (a) improving the absorption of a light to accelerate the exciton generation, (b) improving the absorption of a long-wavelength (near-infrared) light to increase the sunlight utilization efficiency, (c) increasing the open circuit voltage Voc, etc. In view of achieving the procedures of (a) to (c), a donor having (A) a high absorbance coefficient, (B) a small energy level difference between the HOMO and LUMO (a narrow bandgap Eg), and (C) a LUMO energy level close to that of the acceptor may be selected.

Condensed aromatic ring compounds (i.e., π-electron conjugated compounds) described in Japanese Patent No. 4005571 and Japanese Laid-Open Patent Publication Nos. 2010-056492, 2007-019086, and 2010-508677 (PCT) may have the above properties of (A) to (C). Such condensed aromatic ring compounds are sometimes referred to as graphenes (see Japanese Laid-Open Patent Publication No. 2007-019086).

SUMMARY OF THE INVENTION

In a technology described in Japanese Patent No. 4005571, a functional group is bonded to hexabenzocoronene (HBC), and the resultant molecules are self-assembled utilizing the functional groups to obtain a so-called nanotube-like aggregate. Thus, a large number of processes are required to obtain the final semiconductor product. In addition, it is unclear whether the obtained aggregate is a p-type (donor) or an n-type (acceptor).

In Japanese Laid-Open Patent Publication No. 2010-056492, it is suggested that a nanotube composed of an HBC aggregate has both of a hole-conducting path and an electron-conducting path. In a technology described in Japanese Laid-Open Patent Publication No. 2010-056492, the inner and outer surfaces of the nanotube are covered with a fullerene, and the coverage is selected to thereby control the hole mobility in HBC. It is clear from the above that the electron-donating property of HBC per se cannot be improved in the technologies of Japanese Patent No. 4005571 and Japanese Laid-Open Patent Publication No. 2010-056492.

In a technology described in Japanese Laid-Open Patent Publication No. 2007-019086, a functional group having a fluorine atom is bonded to a graphene derivative to obtain an n-type semiconductor. Thus, in this technology, a donor cannot be produced though the acceptor is obtained.

All of Japanese Patent No. 4005571 and Japanese Laid-Open Patent Publication Nos. 2010-056492, 2007-019086, and 2010-508677 (PCT) disclose only organic low-molecular compounds. As is well known, such organic low-molecular compounds are poorly soluble in an organic solvent. Therefore, disadvantageously, it is difficult to use the rollto-roll process or the like in order to form the photoelectric conversion layer containing the compound.

A principal object of the present invention is to provide a photoelectric conversion material that has an excellent property as an electron donor or acceptor, is readily soluble in an organic solvent, and enables a photoelectric conversion layer to be formed simply and easily.

Another object of the present invention is to provide a method for producing the above-mentioned photoelectric conversion material.

A further object of the present invention is to provide an organic photovoltaic cell having the photoelectric conversion layer containing the above-mentioned photoelectric conversion material.

According to an aspect of the invention, there is provided a photoelectric conversion material that acts as an electron donor for donating an electron or an electron acceptor for accepting an electron. The photoelectric conversion material contains a polymer obtained by reaction of a polyphenylene represented by the following general formula (1):

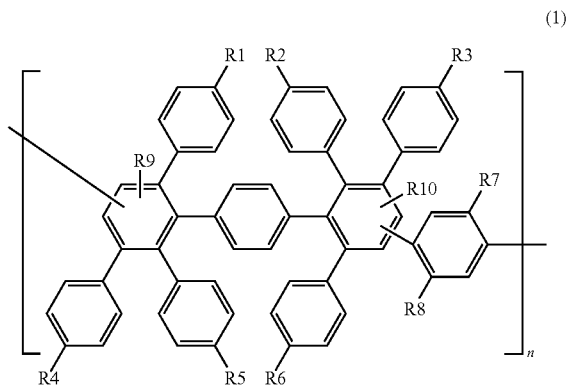

(1)

wherein at least one of R1 to R6 in the general formula (1) is an alkoxy group, and R7 to R10 independently represent a hydrogen atom, an alkyl group, or an alkoxy group.

In a reaction of the polyphenylene represented by the general formula (1), the alkoxy groups of R1 to R6 act as steric hindrances for preventing a plurality of structural units in the polyphenylene from coming close to each other. In a case where the polyphenylene has at least one alkoxy or alkyl group as a side chain in R7 to R10 in the general formula (1), the side chain also acts as a steric hindrance like the above alkoxy group. Therefore, the reaction can sufficiently proceed in each of the structural units in the polyphenylene while preventing the cross-linking between the structural units. Consequently, a π-conjugated polymer having a condensed aromatic ring structural unit, over which a π-electron cloud is sufficiently spread, can be produced by the reaction.

The produced π-conjugated polymer has the soluble alkoxy group. In a case where the polyphenylene has the above side chain in R7 to R10, the obtained π-conjugated polymer further has the soluble side chain.

The photoelectric conversion material of the present invention contains the above-mentioned π-conjugated polymer. The π-conjugated polymer is hereinafter referred to also as "nanographene polymer". The nanographene polymer can have a high absorbance coefficient and can actively generate an exciton because the π-electron cloud spreads along the main chain. Furthermore, the nanographene polymer can exhibit a small energy level difference between the HOMO and the LUMO, and thus can have a narrow bandgap Eg. In addition, the nanographene polymer can have a maximum absorption wavelength shifted to the long-wavelength side, and thereby can excellently absorb a long-wavelength (near-infrared) light. Consequently, the nanographene polymer can exhibit an improved sunlight utilization efficiency.

Furthermore, the nanographene polymer can have a LUMO energy level lower (deeper) than those of P3HT and the like. Therefore, a photoelectric conversion layer using the nanographene polymer as a donor and the PCBM as an acceptor can exhibit an energy loss lower than that of a layer using the P3HT as a donor. Consequently, an organic photovoltaic cell using the nanographene polymer as the donor in the photoelectric conversion layer can exhibit a high open circuit voltage Voc.

For the above reasons, the organic photovoltaic cell containing the nanographene polymer as the photoelectric conversion material can have an improved photoelectric power conversion efficiency.

As described above, formation of the cross-linking is prevented in the nanographene polymer, and the soluble alkoxy group is introduced into the nanographene polymer. Therefore, the nanographene polymer can be significantly readily dissolved in an organic solvent.

Furthermore, in a case where the nanographene polymer is derived from the nanographene having the above side chain in R7 to R10 in the general formula (1), the nanographene polymer has a high soluble group content. Therefore, the nanographene polymer exhibits a high solubility in the organic solvent. In particular, in a case where the nanographene polymer has the alkoxy group as the side chain, the solubility in the organic solvent can be further improved.

Therefore, even in a case where the molecular weight of the condensed aromatic ring is increased in order to improve the sunlight utilization efficiency, the nanographene polymer can be readily dissolved in the organic solvent. Thus, the photoelectric conversion layer can be formed simply and easily by using a spin coating process, a roll-to-roll process, etc.

It is preferred that all of R1 to R10 in the general formula (1) should be alkoxy groups. The soluble group is more preferably a $C_1$-$C_{20}$ alkoxy group. The same applies to general formulae (2) and (3) to be hereinafter described.

In a case where all of R1 to R10 are alkoxy groups, a plurality of the structural units in the polyphenylene can be prevented more effectively from coming close to each other. Thus, formation of the cross-linking in the nanographene polymer can be prevented more effectively. Furthermore, by bonding alkoxy groups to all of R1 to R10, the nanographene polymer has a higher affinity for the organic solvent, and therefore exhibits a higher solubility in the organic solvent.

In a case where the alkoxy group has 1 to 20 carbon atoms, the structural units in the polyphenylene can be prevented from coming close to each other, and the solubility of the nanographene polymer in the organic solvent can be sufficiently increased. Thus, when the carbon number of the alkoxy group is within the above range, the nanographene polymer, which can exhibit an excellent property as the donor and can be sufficiently dissolved in the organic solvent to form the layer simply and easily, can be efficiently produced.

Preferred examples of the nanographene polymers include polymers having at least one structural unit selected from graphenes represented by the following general formulae (2) and (3):

(2)

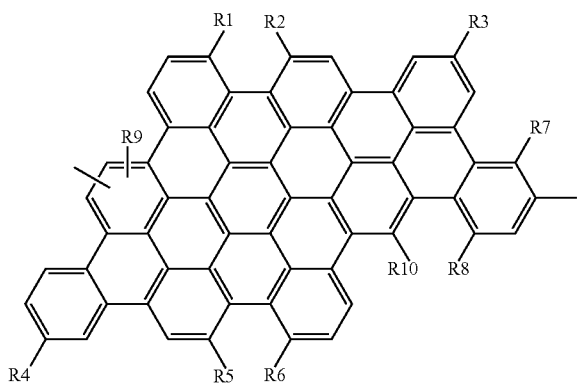

(3)

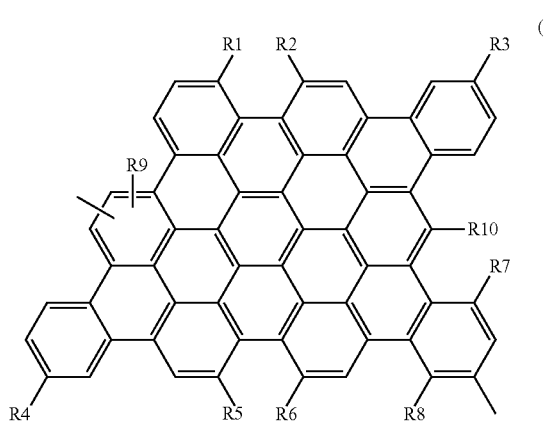

wherein at least one of R1 to R6 in each of the general formulae (2) and (3) is an alkoxy group, and R7 to R10 independently represent a hydrogen atom, an alkyl group, or an alkoxy group.

In the present invention, the condensed aromatic ring is referred to as "graphene" as in Japanese Laid-Open Patent Publication No. 2007-019086. Nanometer-scale graphene such as the structural units represented by the general formulae (2) and (3) is also referred to as "nanographene".

The nanographene polymer preferably has a polymerization degree (the number of the structural units) of 2 to 1,000. When the polymerization degree is 2 or more, the absorbance coefficient can be sufficiently increased, and the Eg can be sufficiently narrowed. On the other hand, when the polymerization degree is 1,000 or less, the time required for the polymerization can be shortened, and the production efficiency of the nanographene polymer can be improved. Thus, when the polymerization degree is within the above range, the nanographene polymer can be efficiently produced with an excellent donor property.

In the case of using the above graphene as the structural unit of the nanographene polymer, the nanographene polymer has a molecular weight of 1,500 to 4,000,000.

According to another aspect of the invention, there is provided a method for producing a photoelectric conversion material that acts as an electron donor for donating an electron or an electron acceptor for accepting an electron. The method contains polymerizing a phenylene derivative to prepare a polyphenylene and reacting the polyphenylene to prepare a polymer as the photoelectric conversion material. The polyphenylene is represented by the following general formula (1):

(1)

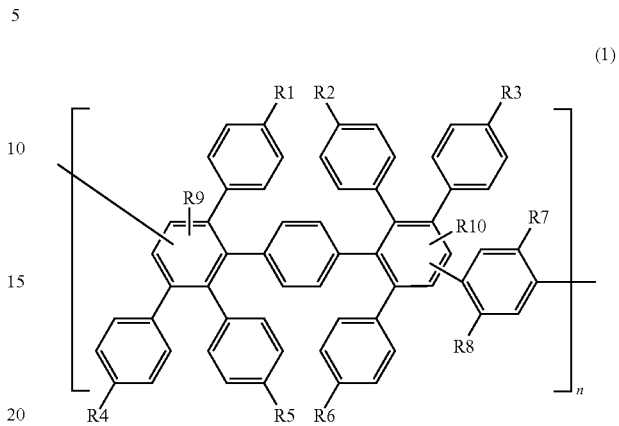

wherein at least one of R1 to R6 in the general formula (1) is an alkoxy group, and R7 to R10 independently represent a hydrogen atom, an alkyl group, or an alkoxy group.

The method is capable of readily producing the nanographene polymer with a uniform structure as the photoelectric conversion material (the donor or the acceptor).

It is preferred that all of R1 to R10 should be alkoxy groups. In this case, formation of the cross-linking in the nanographene polymer can be prevented more effectively. Furthermore, the nanographene polymer can have a higher affinity for the organic solvent, and thus can exhibit a higher solubility in the organic solvent.

In this method, in a case where the alkoxy group has 1 to 20 carbon atoms, the nanographene polymer, which can exhibit an excellent property as the donor and can be sufficiently dissolved in the organic solvent to form the layer easily, can be efficiently produced.

In a typical example, the nanographene polymer has at least one structural unit selected from graphenes represented by the following general formulae (2) and (3):

(2)

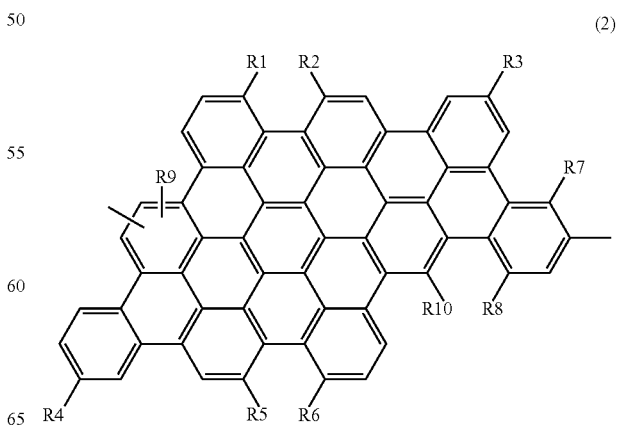

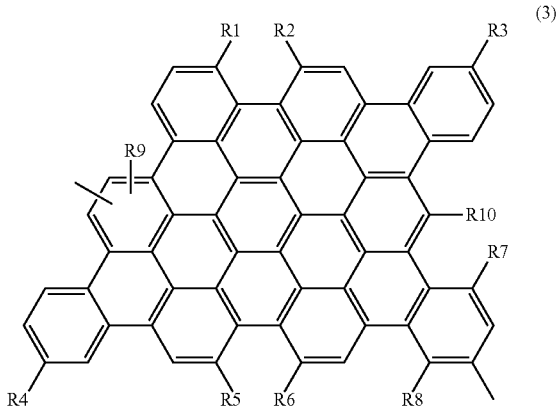

(3)

wherein at least one of R1 to R6 in each of the general formulae (2) and (3) is an alkoxy group, and R7 to R10 independently represent a hydrogen atom, an alkyl group, or an alkoxy group.

In the present invention, for example, first, the phenylene derivative having the alkoxy group is prepared and polymerized to obtain the polyphenylene having the alkoxy group. The polyphenylene is further reacted to produce the nanographene polymer (the photoelectric conversion material) containing the nanographene structural unit having the alkoxy group.

It is preferred that the polymerization degree of the nanographene polymer is controlled within a range of 2 to 1,000 for the above reasons. For example, the polymerization degree of 2 to 1,000 can be achieved by appropriately selecting the reaction temperature and/or the reaction time in the polymerization.

According to a further aspect of the invention, there is provided an organic photovoltaic cell using the above-described photoelectric conversion material. The organic photovoltaic cell has a photoelectric conversion layer containing the photoelectric conversion material as an electron donor.

In the organic photovoltaic cell, for example, in the case of using PCBM as an acceptor, the photoelectric conversion layer using the nanographene polymer as the donor can exhibit a higher absorbance coefficient and can have a maximum absorption wavelength shifted to the longer-wavelength side as compared with a layer using P3HT. Furthermore, the donor can exhibit a narrower bandgap Eg. In addition, the donor can have a LUMO energy level closer to that of the PCBM acceptor.

Therefore, the organic photovoltaic cell can exhibit an active exciton generation property, an improved sunlight utilization efficiency, and a high open circuit voltage Voc. Thus, the organic photovoltaic cell can have an improved photoelectric power conversion efficiency.

Since the organic photovoltaic cell has a high photoelectric power conversion efficiency, only a smaller area is required for achieving a desired power generation capacity in comparison with the other photovoltaic cells having the same power generation capacity. Therefore, the organic photovoltaic cell can have a light weight and a small load applied on its installation site. Furthermore, the organic photovoltaic cell can be placed in a smaller site, so that the layout of the solar cell can be designed more freely.

The nanographene polymer has the alkoxy group, and thereby is readily soluble in the organic solvent. Therefore, the photoelectric conversion layer can be formed simply and easily using the nanographene polymer. Thus, the organic photovoltaic cell per se can be produced simply and easily.

For example, the organic photovoltaic cell is preferably a bulk heterojunction-type organic photovoltaic cell having a photoelectric conversion layer containing a mixture of a donor domain and an acceptor domain. The bulk heterojunction-type photovoltaic cell has a larger contact area between the donor and acceptor domains, as compared with a planar heterojunction-type photovoltaic cell having a donor layer and an acceptor layer formed separately from each other. In the organic photovoltaic cell, the exciton is divided into the electron and hole mainly on the interface between the donor and acceptor domains thereby for power generation. Therefore, in a case where the organic photovoltaic cell is formed as the bulk heterojunction-type, which has a larger contact area between the donor and acceptor domains, the photoelectric power conversion efficiency can be improved.

Particularly, the nanographene polymer is readily soluble in the organic solvent, whereby the photoelectric conversion layer can be easily formed in the bulk heterojunction-type organic photovoltaic cell by use of the nanographene polymer. The photoelectric conversion layer can contain a mixture of the donor and acceptor domains in a desired phase separation state. Thus, the charge separation efficiency of the photoelectric conversion layer can be improved, and the photoelectric power conversion efficiency of the organic photovoltaic cell can be improved.

The above and other objects, features and advantages of the present invention will become more apparent from the following description when taken in conjunction with the accompanying drawings in which a preferred embodiment of the present invention is shown by way of illustrative example.

BRIEF DESCRIPTION OF THE DRAWINGS

FIG. 8 is a table showing the power generation performance of a BHJ solar cell according to Example 1;

DESCRIPTION OF THE PREFERRED EMBODIMENTS

A preferred embodiment of the photoelectric conversion material and the production method of the present invention will be described in detail below, using a bulk heterojunction-type organic photovoltaic cell having a photoelectric conversion layer containing the material with reference to the accompanying drawings.

Figure 1:
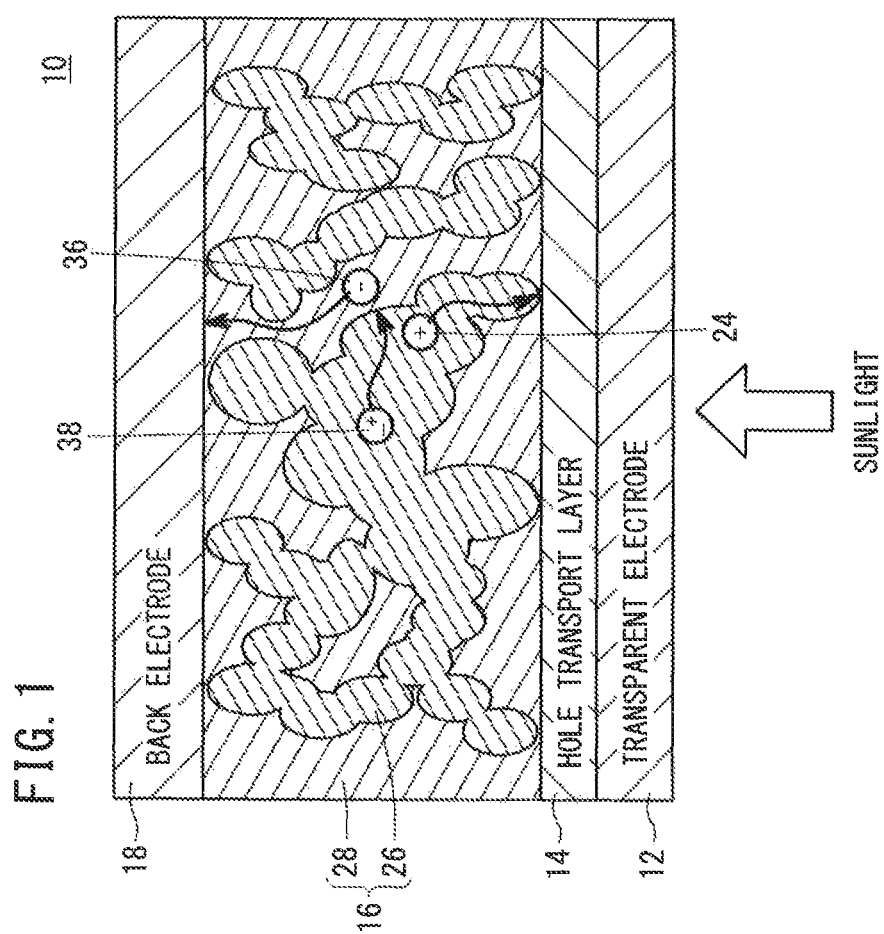
FIG. 1 is a schematic longitudinal cross-sectional view of a principal part in a bulk heterojunction-type organic photovoltaic cell according to an embodiment of the present invention.

FIG. 1 is a schematic longitudinal cross-sectional view of a principal part in a bulk heterojunction-type organic photovoltaic cell (BHJ solar cell) 10 according to this embodiment. In the BHJ solar cell 10, a hole transport layer 14, a photoelectric conversion layer 16, and a back electrode 18 are stacked in this order on a transparent electrode 12.

The transparent electrode 12 acts as a positive electrode. Thus, holes 24 are transferred to the transparent electrode 12. The transparent electrode 12 may be composed of a material having a sufficient transmittance of a light such as sunlight, and examples of such materials include indium-tin composite oxide (ITO).

The hole transport layer 14 acts to accelerate the transfer of the holes 24 from the photoelectric conversion layer 16 to the transparent electrode 12. In general, the hole transport layer 14 may contain a poly(3,4-ethylenedioxythiophene) doped with a polystyrene sulfonic acid, i.e., a so-called PEDOT:PSS.

The photoelectric conversion layer 16 contains a combination of a donor domain 26 and an acceptor domain 28. The donor domain 26 contains a photoelectric conversion material that acts as an electron donor (donor), and the acceptor domain 28 contains a photoelectric conversion material that acts as an electron acceptor (acceptor). Preferred examples of the photoelectric conversion materials as the acceptor include PCBM.

The donor is a p-type semiconductor composed of a photoelectric conversion material according to this embodiment. The photoelectric conversion material of this embodiment contains a nanographene polymer, which is a reaction product of a polyphenylene represented by the following general formula (1).

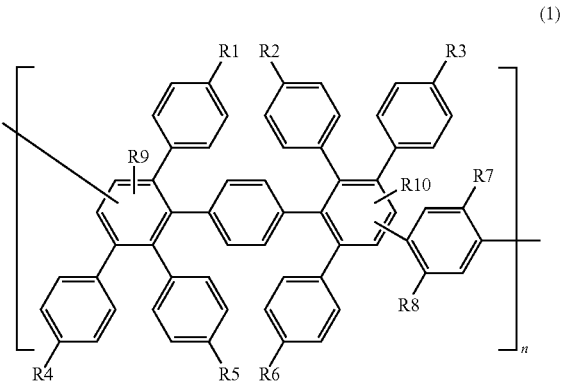

(1)

At least one of R1 to R6 in the general formula (1) is an alkoxy group, and R7 to R10 independently represent a hydrogen atom, an alkyl group, or an alkoxy group.

Figure 2:
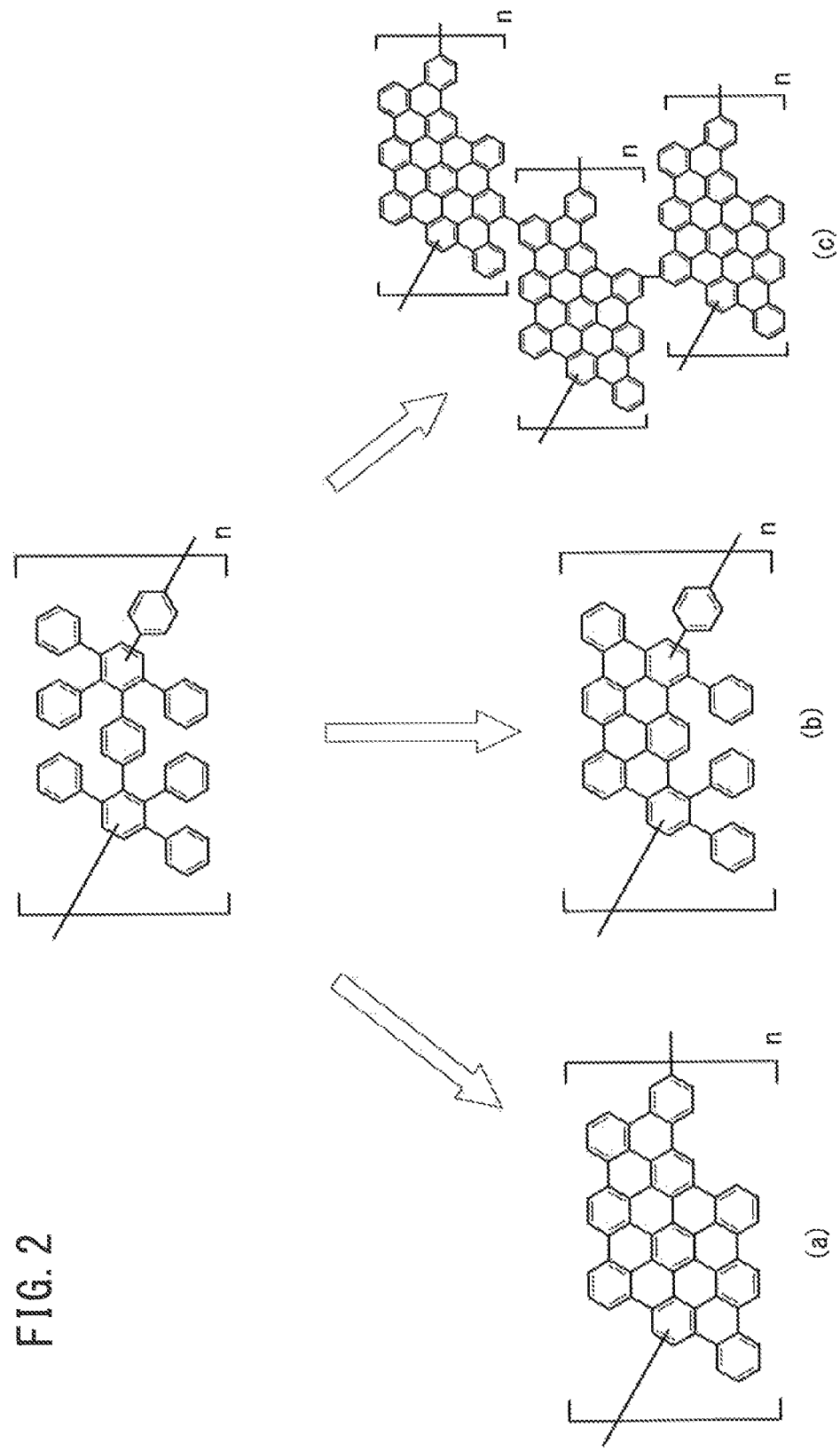
FIG. 2 is an explanatory structural view of reaction products derived from an unsubstituted polyphenylene.

In a case where an unsubstituted polyphenylene having no functional groups is reacted to produce the polymer, it is ideal that all the aromatic rings in each structural unit are reacted to form a nanographene structure indicated by (a) in FIG. 2.

When the reaction of the polyphenylene does not sufficiently proceed, the resultant polymer has unreacted aromatic rings in the structural unit as shown by (b) in FIG. 2. Therefore, the π-conjugated polymer often fails to have a sufficiently spread π-electron cloud.

When the reaction of the polyphenylene proceeds excessively, the aromatic rings in each structural unit are reacted with each other, and furthermore the structural units are often cross-linked with each other as shown by (c) in FIG. 2. Thus, the resultant polymer has a cross-linked structure, and thereby may be poorly soluble or insoluble in an organic solvent or the like. Consequently, it is difficult to use a solution of the polymer for forming the photoelectric conversion layer 16.

Figure 3:
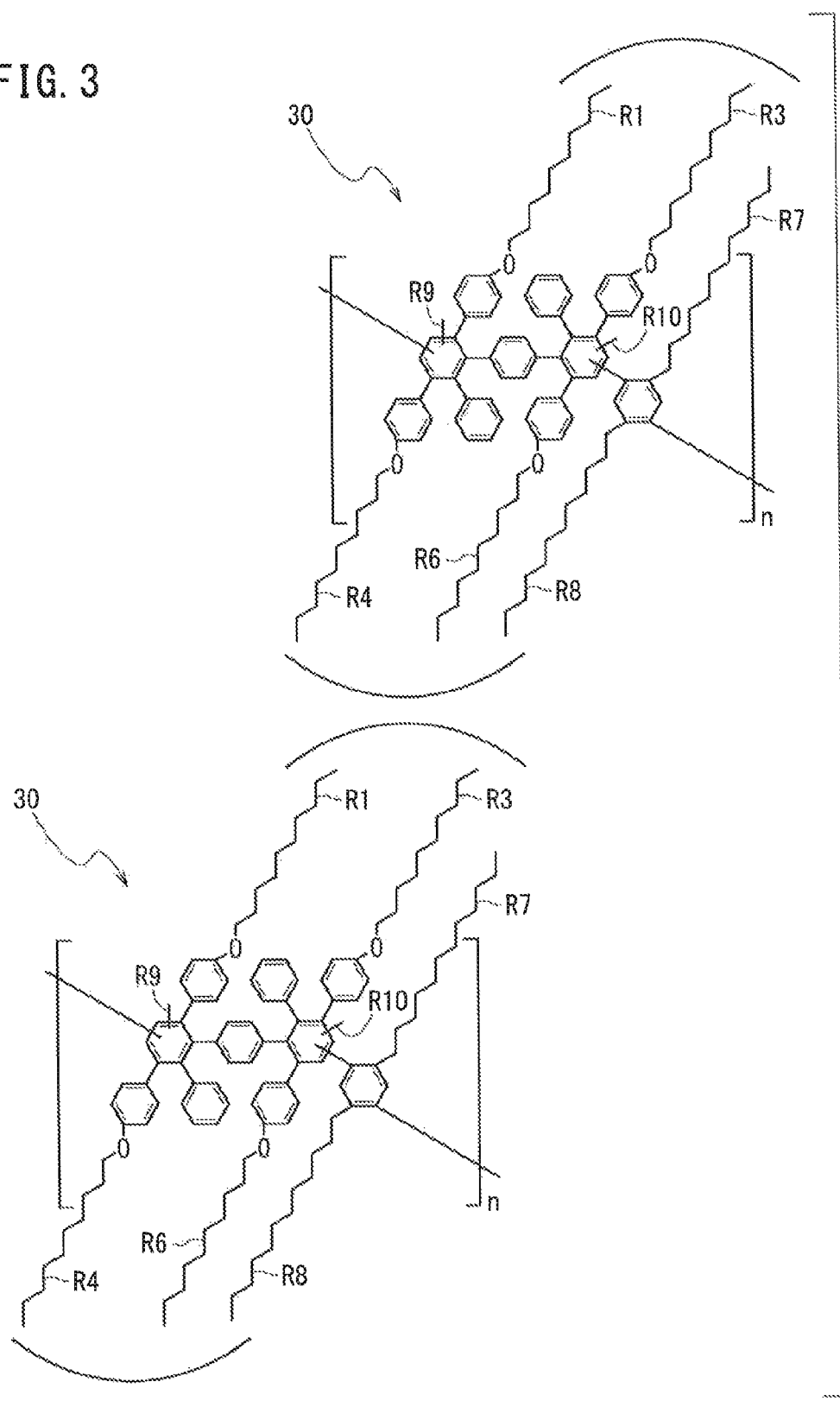
FIG. 3 is a schematic structural view for illustrating a relationship between structural units in a polyphenylene having alkoxy groups and the alkoxy groups.

The polyphenylene of this embodiment has the alkoxy group as a soluble group as described above. For example, as shown in FIG. 3, the soluble group acts as a steric hindrance in the reaction between the structural units 30 in the polyphenylene. Thus, the soluble group can prevent the structural units 30 from coming close to each other.

In the example of FIG. 3, R1, R3, R4, and R6 in the general formula (1) are alkoxy groups $OC_{10}H_{21}$, R7 and R8 are alkyl groups $C_{12}H_{25}$, and R9 and R10 are alkyl groups $CH_3$. The polyphenylene is not limited to the example.

In the polyphenylene having the soluble groups R1 to R10, a plurality of the structural units can be prevented from reacting with each other, and the aromatic rings in each structural unit can be effectively reacted with each other. Thus, the nanographene polymer, which does not have a cross-linked structure of the structural units and has a sufficiently spread π-electron cloud, can be produced.

The nanographene polymer is obtained by reacting the polyphenylene having the soluble group as the side chain. Therefore, also the nanographene polymer has the soluble group. Consequently, the nanographene polymer can be readily soluble in the organic solvent.

It is preferred that all of R1 to R10 in the general formula (1) are alkoxy groups from the viewpoint of improving the solubility of the nanographene polymer. In this case, the nanographene polymer has a high alkoxy group content, and the solubility is increased more effectively.

The alkoxy group preferably has 1 to 20 carbon atoms. When the carbon number of the alkoxy group is within this range, the structural units in the polyphenylene can be prevented from coming close to each other, and the solubility of the nanographene polymer in the organic solvent can be improved. Thus, the polymer, which can exhibit an excellent property as the donor and can be readily dissolved in the organic solvent to form the layer, can be efficiently produced.

Figure 4:
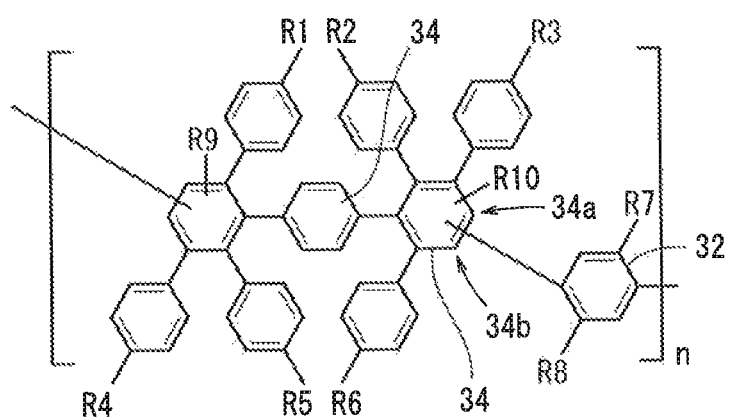
FIG. 4 is an explanatory view for illustrating a structural unit in a polyphenylene having an alkoxy group.

Structural isomers of the nanographene polymer derived from the polyphenylene will be described below. As shown in FIG. 4, in the structural unit of the polyphenylene, a benzene ring 32 may be bonded to any one of positions 34a and 34b in a benzene ring 34. Thus, the nanographene polymer has at least one structural unit selected from nanographenes represented by the following general formulae (2) and (3).

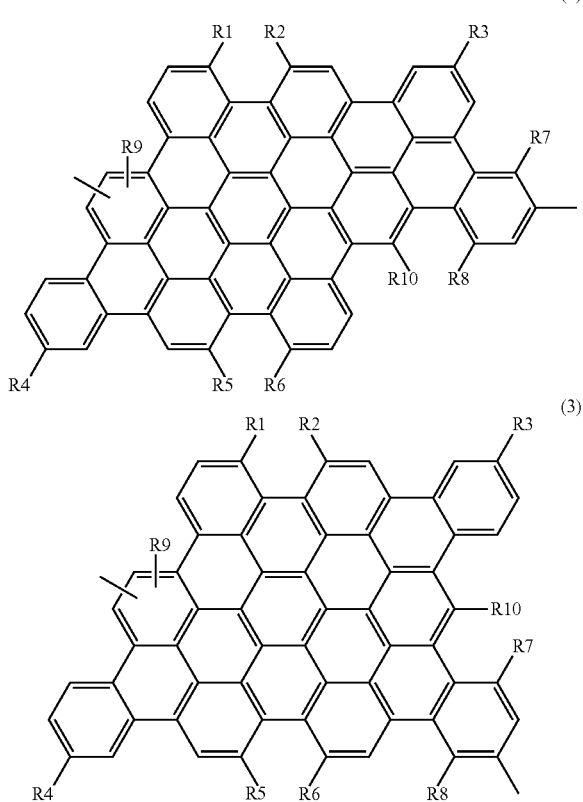

At least one of R1 to R6 in each of the general formulae (2) and (3) is an alkoxy group, and R7 to R10 independently represent a hydrogen atom, an alkyl group, or an alkoxy group.

Thus, the photoelectric conversion material of this embodiment contains the nanographene polymer having at least one structural unit selected from the nanographenes represented by the general formulae (2) and (3). The nanographene polymer may contain only one type of the nanographenes represented by one of the general formulae (2) and (3), and the nanographenes may be bonded to each other, but the nanographene polymer is not limited thereto. For example, the nanographene polymer may be such that the nanographenes represented by the general formulae (2) and (3) are randomly bonded.

The polymerization degree of the nanographene polymer is preferably 2 to 1,000. When the polymerization degree (i.e., the number n of the nanographenes bonded to each other) is 2 or more, the absorbance coefficient can be sufficiently increased. On the other hand, when the polymerization degree (i.e., the number n of the nanographenes bonded to each other) is 1,000 or less, the time required for the polymerization for producing the nanographene polymer can be shortened, and accordingly the production efficiency of the nanographene polymer can be improved. Thus, when the polymerization degree is within the above range, the photoelectric conversion material having a sufficiently improved absorbance coefficient can be efficiently produced.

The nanographenes represented by the general formulae (2) and (3) have a molecular weight of 750 to 4,000. Thus, when the nanographene polymer has a polymerization degree of 2 to 1,000, the nanographene polymer has a molecular weight of 1,500 to 4,000,000.

In the BHJ solar cell 10 (see FIG. 1), the back electrode 18 is stacked on the photoelectric conversion layer 16 containing the photoelectric conversion material containing the nanographene polymer. The back electrode 18 acts as a negative electrode, to which electrons 36 are transferred. An electron transport layer (not shown) containing bathocuproine, lithium fluoride, or the like may be interposed between the photoelectric conversion layer 16 and the back electrode 18. The electron transport layer can act to accelerate the transfer of the electrons 36 generated at the photoelectric conversion layer 16 to the back electrode 18.

The BHJ solar cell 10 of this embodiment has the above-described basic structure. Operations and advantageous effects of the BHJ solar cell 10 will be described below.

When a light (such as sunlight) is injected to the transparent electrode 12 in the BHJ solar cell 10, the light is transferred through the hole transport layer 14 to the photoelectric conversion layer 16. Then, excitons 38 are generated in the photoelectric conversion layer 16.

The generated excitons 38 are moved in the donor domain 26, and reach the interface between the donor domain 26 and the acceptor domain 28. The excitons 38 are divided into the electrons 36 and the holes 24 on the interface. As described above, the electrons 36 are moved in the acceptor domain 28, are transferred through the electron transport layer, and reach the back electrode 18 used as the negative electrode. On the other hand, the holes 24 are moved in the donor domain 26, are transferred through the hole transport layer 14, and reach the transparent electrode 12 used as the positive electrode.

In this embodiment, the donor domain 26 in the photoelectric conversion layer 16 contains the nanographene polymer (the photoelectric conversion material) having at least one structural unit selected from the nanographenes represented by the general formulae (2) and (3).

As is clear from the general formulae (2) and (3), the π-electron cloud spreads over the entire nanographene. The donor domain 26 contains the nanographene polymer having the structural unit of the nanographene. Thus, the π-electron cloud spreads over a wider area in the donor domain 26 than in the single nanographene (monomer).

The donor domain 26, which has such a sufficiently spread π-electron cloud, exhibits a maximum absorption wavelength shifted to the longer-wavelength side and has a high absorbance coefficient. Thus, the donor domain 26 exhibits a narrow bandgap (Eg) corresponding to a small energy level difference between the HOMO and LUMO. Consequently, the excitons 38 are actively generated in the donor domain 26, resulting in a high sunlight utilization efficiency.

The BHJ solar cell 10 exhibits an excellent photoelectric power conversion efficiency because of the above properties. Therefore, only a smaller area of the BHJ solar cell 10 is required for achieving a desired power generation capacity in comparison with the other solar cells having the same power generation capacity. Consequently, the BHJ solar cell 10 can have a lighter weight and a smaller load on its installation site, so that the layout of the BHJ solar cell 10 can be designed more freely.

A method for producing the photoelectric conversion material (i.e., the nanographene polymer) according to this embodiment will be described below.

As described above, the nanographene polymer can be obtained as the reaction product derived from the polyphenylene. An example, which contains reacting the polyphenylene of FIG. 3 (wherein R1, R3, R4, and R6 are $OC_{10}H_{21}$ groups, R7 and R8 are $C_{12}H_{25}$ groups, and R9 and R10 are $CH_3$ groups in the general formula (1)) to produce the nanographene polymer, will be described hereinafter.

First, a dibenzyl ketone having the alkoxy groups (OC$_{10}$H$_{21}$) is prepared to produce the polyphenylene. Specifically, 4-hydroxybenzeneacetic acid methyl ester is reacted with 1-iododecane to obtain 4-decyloxybenzeneacetic acid methyl ester as shown in the following reaction formula (4).

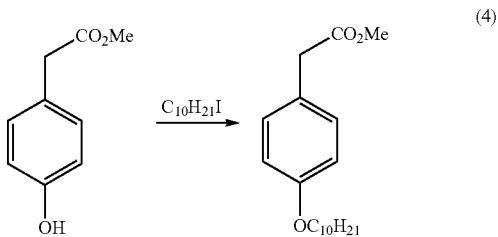

Then, lithium diisopropylamide (LDA) is added to 4-decyloxybenzeneacetic acid methyl ester, and hydrochloric acid is further added to the intermediate as shown in the following reaction formula (5). As a result, 1,3-didecyloxybenzene-2-propanone is prepared as the dibenzyl ketone having the alkoxy groups.

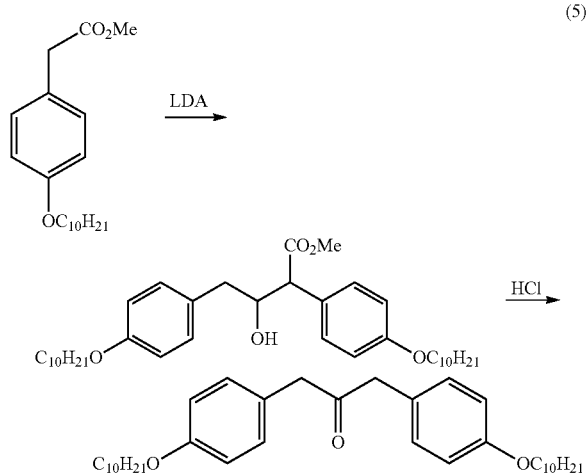

Then, 1,3-didecyloxybenzene-2-propanone and a 1,4-bisbenzil are reacted to prepare an alkoxylated 3,3'-(1,4-phenylene)bis(2,4,5-triphenyl-2,4-cyclopentadiene-1-one) (phenylene derivative). Specifically, a methanol solution of Triton B is added to a mixture solution containing 1,3-didecyloxybenzene-2-propanone, the 1,4-bisbenzil, and n-butanol under heating as shown in the following reaction formula (6). Triton B is benzyltrimethylammonium hydroxide. As a result, the alkoxylated 3,3'-(1,4-phenylene)bis(2,4,5-triphenyl-2,4-cyclopentadiene-1-one) is prepared.

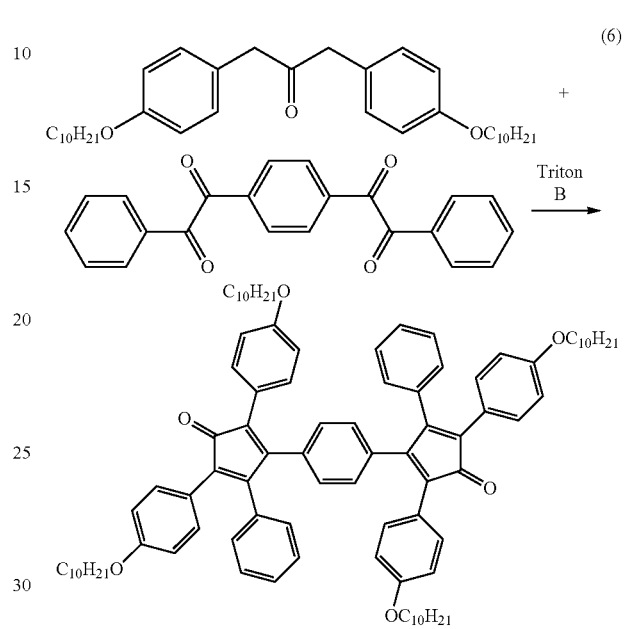

A Diels-Alder polymerization reaction of the thus-obtained 3,3'-(1,4-phenylene)bis(2,4,5-triphenyl-2,4-cyclopentadiene-1-one) and 1,4-bis(1-propynyl)-2,5-didodecylbenzene is carried out as shown in the following reaction formula (7). As a result, the polyphenylene having the soluble groups is obtained. In this case, by reacting the 3,3'-(1,4-phenylene)bis(2,4,5-triphenyl-2,4-cyclopentadiene-1-one) having the alkoxy groups and the 1,4-bis(1-propynyl)-2,5-didodecylbenzene having the alkyl groups, the polyphenylene can be efficiently generated. Furthermore, the alkoxy groups and the alkyl groups can be introduced to the polyphenylene in this manner, so that the solubility of the polyphenylene in the organic solvent can be further increased.

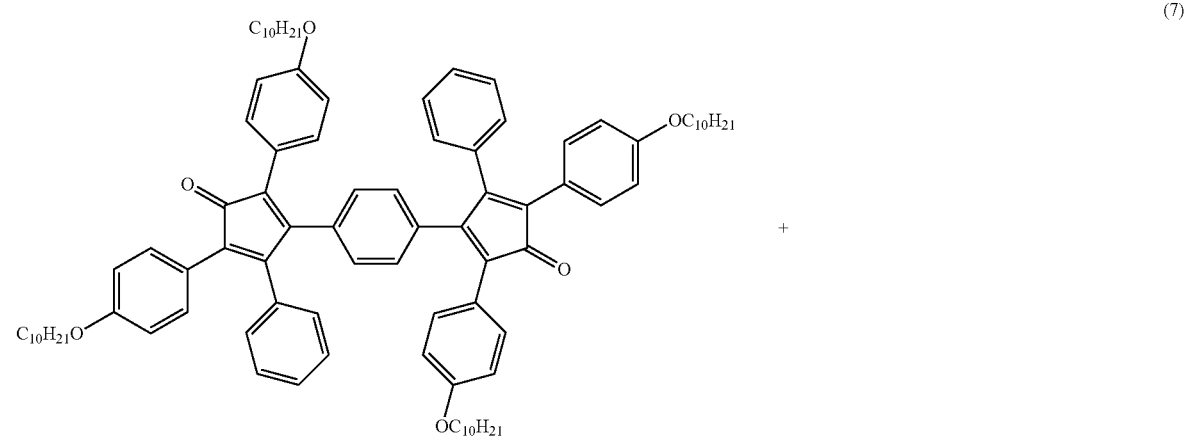

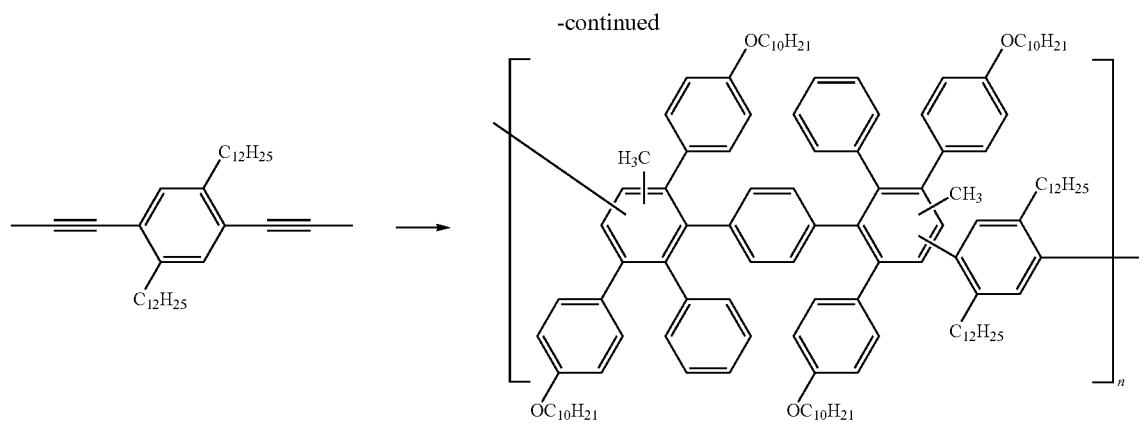

For example, the thus-obtained polyphenylene is reacted in the presence of a Lewis acid catalyst such as ferric chloride (FeCl$_3$) to produce the nanographene polymer having the alkoxy and alkyl groups as shown in the following reaction formula (8). Specifically, the produced nanographene polymer may be one of the above-described structural isomers having the OC$_{10}$H$_{21}$ groups in R1, R3, R4, and R6, the C$_{12}$H$_{25}$ groups in R7 and R8, and the CH$_3$ groups in R9 and R10 in the general formulae (2) and (3).

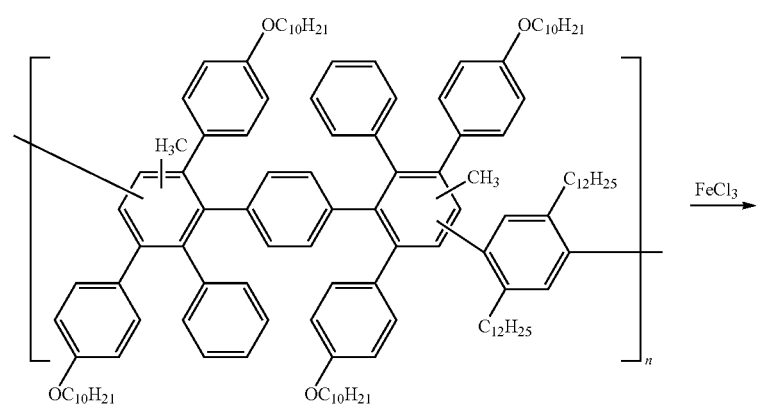

(8)

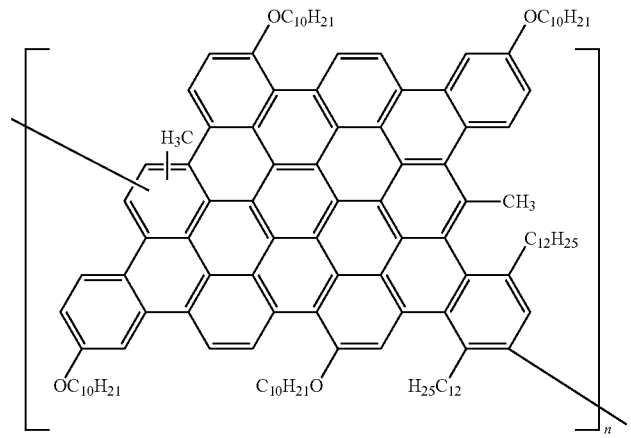

or

-continued

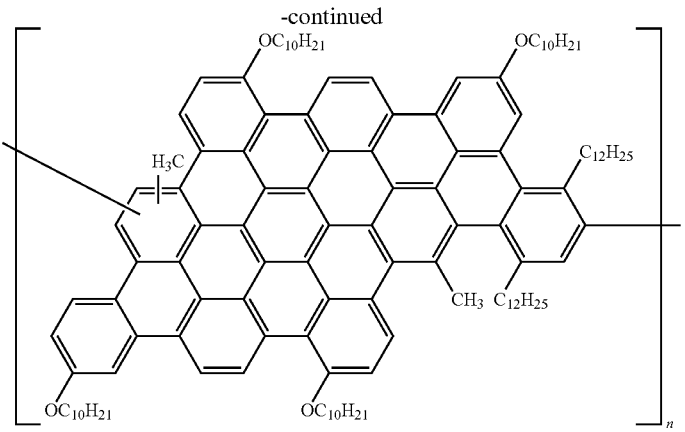

Since the polyphenylene has the alkoxy and alkyl groups as described above, coupling of the structural units (intermolecular coupling) is inhibited in this reaction. Therefore, all the aromatic rings in each of the structural units can be reacted, while preventing the cross-linking between the structural units, e.g., by controlling the amount of the ferric chloride catalyst. Consequently, the π-electron cloud can be sufficiently spread over the structural units in the condensed aromatic ring nanographene polymer.

The polymerization degree of the nanographene polymer can be controlled, preferably within a range of 2 to 1,000, e.g., by appropriately selecting the reaction temperature and/or the reaction time in the polymerization. In this case, the photoelectric conversion material (nanographene polymer) having a sufficiently-improved absorbance coefficient can be efficiently produced.

For example, by using another substance, instead of 1,3-didecyloxybenzene-2-propanone, as a substance to be reacted with the 1,4-bisbenzil in the above reaction formula (6), the side chain in R1 to R6 can be changed in the general formulae (2) and (3).

Furthermore, by using another substance, instead of 1,4-bis(1-propynyl)-2,5-didodecylbenzene, as a substance to be reacted with the 3,3'-(1,4-phenylene)bis(2,4,5-triphenyl-2,4-cyclopentadiene-1-one) in the Diels-Alder polymerization reaction of the reaction formula (7), the side chain in R7 to R10 can be changed in the general formulae (2) and (3).

Figure 5:
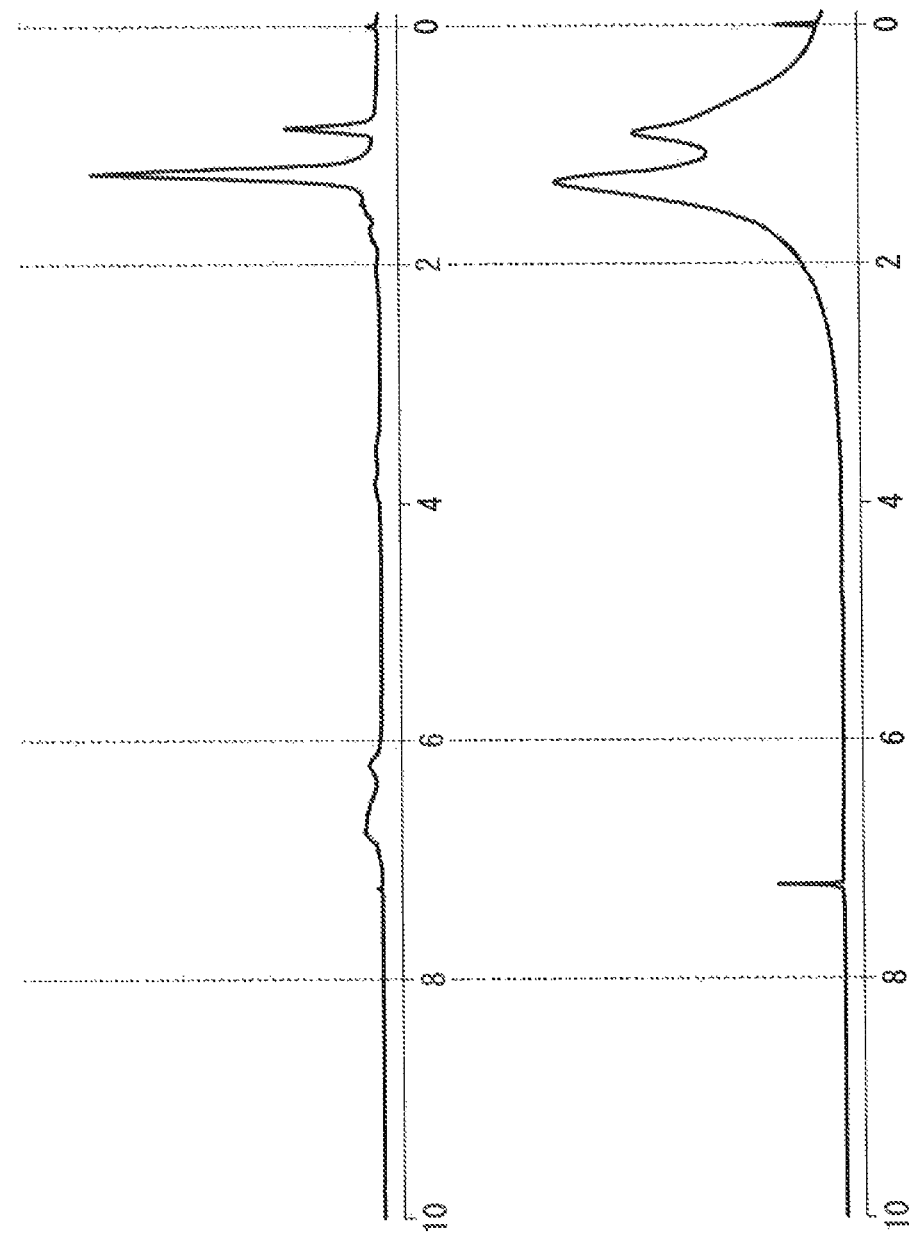
FIG. 5 is a diagram including $^1$H-nuclear magnetic resonance (NMR) spectra of the polyphenylene of FIG. 3 and a photoelectric conversion material (nanographene polymer) according to this embodiment obtained by reacting the polyphenylene.

FIG. 5 is a diagram including $^1$H-nuclear magnetic resonance (NMR) spectra of the polyphenylene having the soluble groups (shown in FIG. 3) and the nanographene polymer obtained by the reaction of the polyphenylene. In the spectra, peaks of the hydrogen atoms in the alkoxy groups are observed within a range of 0 to 2 ppm, and peaks of the hydrogen atoms in the phenyl groups are observed within a range of 6 to 8 ppm.

As shown in FIG. 5, the peaks of the hydrogen atoms in the alkoxy groups are observed in the spectrum of the polyphenylene, and are observed also in the spectrum of the nanographene polymer. It is clear that the nanographene polymer having the alkoxy groups can be produced by the reaction of the polyphenylene having the alkoxy groups.

The peaks of the hydrogen atoms in the phenyl groups are observed in the spectrum of the polyphenylene, but are not observed in the spectrum of the nanographene polymer. It is clear that the phenyl groups in the structural units of the polyphenylene are reacted with each other to form the condensed aromatic rings in the nanographene polymer. Thus, the nanographene polymer is a π-conjugated polymer.

Figure 6:
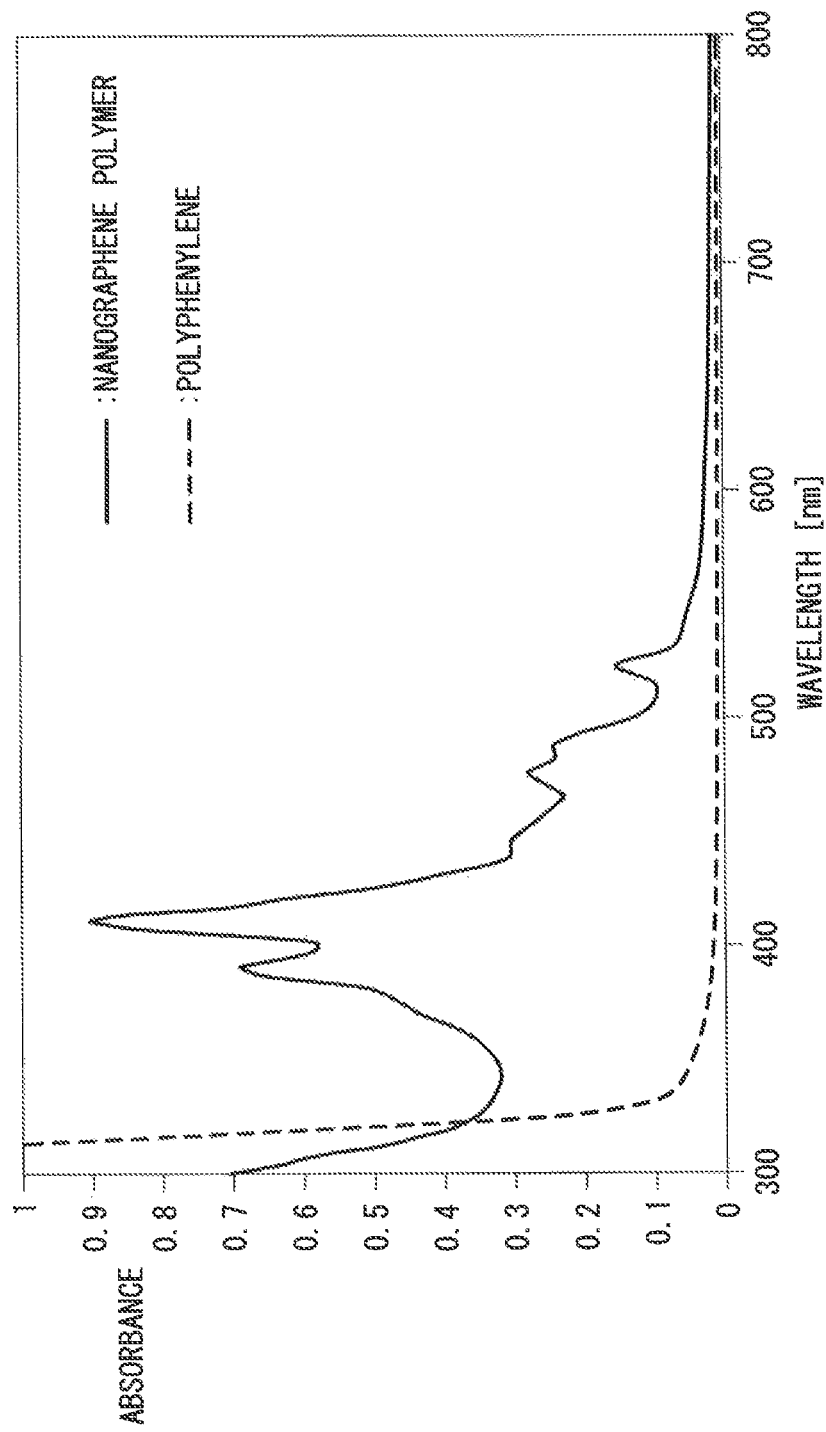
FIG. 6 is a diagram including absorption spectra obtained by ultraviolet-visible spectroscopy concerning the polyphenylene of FIG. 3 and the nanographene polymer obtained by reacting the polyphenylene.

FIG. 6 is a diagram including ultraviolet-visible (UV-Vis) absorption spectra of the polyphenylene having the soluble groups (shown in FIG. 3) and the nanographene polymer obtained by the reaction of the polyphenylene.

As shown in FIG. 6, the long-wavelength absorption edge of the polyphenylene is observed at about 330 nm, while the long-wavelength absorption edge of the nanographene polymer is observed at about 585 nm. Thus, the maximum absorption wavelength of the nanographene polymer is shifted to the longer-wavelength side as compared with the long-wavelength absorption edge (i.e., the maximum absorption wavelength) of the polyphenylene. In general, in a π-conjugated system, as the molecular weight and the π-electron number is increased, the maximum absorption wavelength is shifted to the longer-wavelength side and the light absorption region is expanded to the visible region. Thus, it is clear from FIG. 6 that the nanographene polymer is the π-conjugated polymer having the π-electron cloud sufficiently spread over the condensed aromatic ring structural units.

Figure 7:
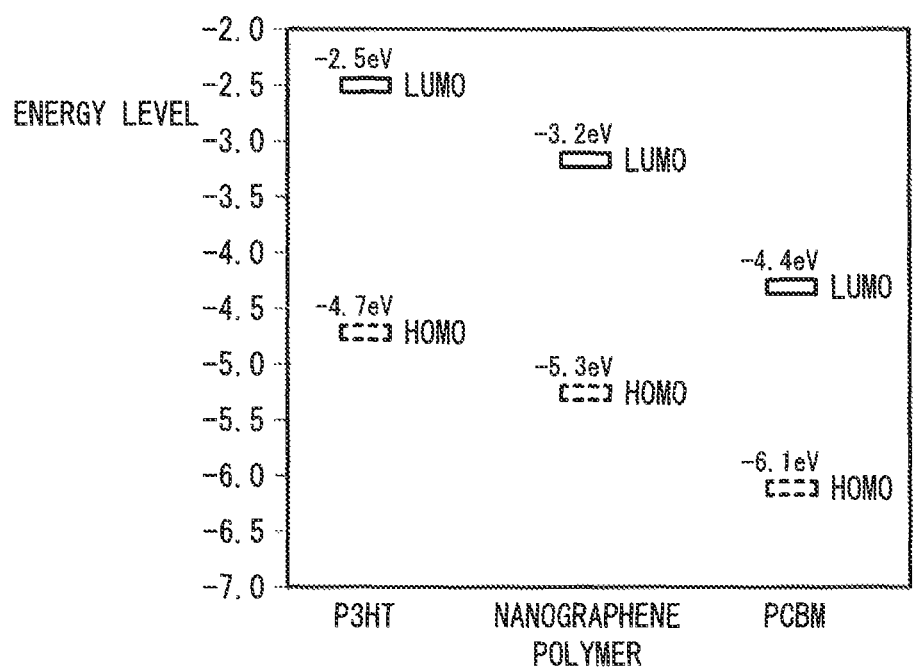
FIG. 7 is an energy level diagram showing the HOMO and LUMO energy levels of the nanographene polymer obtained by reacting the polyphenylene of FIG. 3, P3HT, and PCBM.
Figure 9:
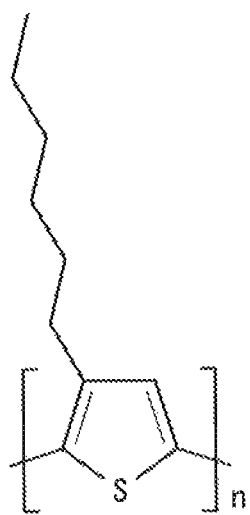
FIG. 9 is an explanatory view of a structural formula of P3HT.
Figure 10:
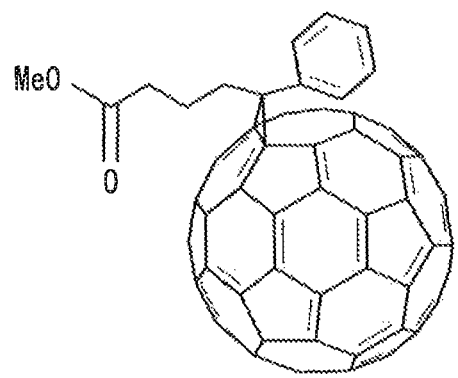
FIG. 10 is an explanatory view of a structural formula of PCBM.
Figure 11:
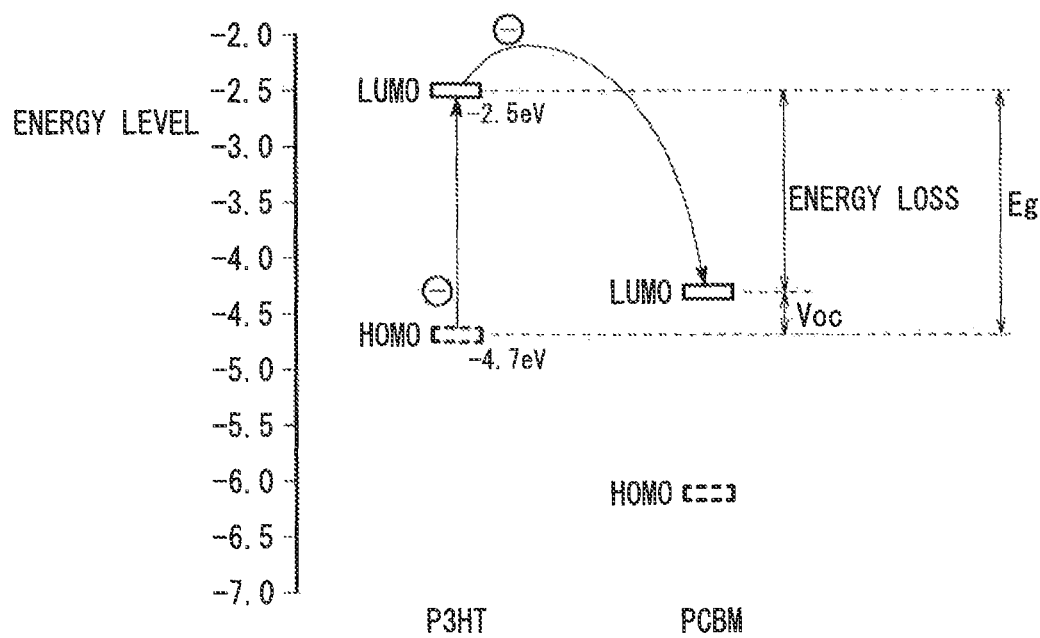
FIG. 11 is a schematic explanatory view for illustrating electron transition from the HOMO of P3HT through the LUMO of P3HT to the LUMO of PCBM.

FIG. 7 is a diagram showing the HOMO and LUMO energy levels of the nanographene polymer, P3HT, and PCBM, measured by an ultraviolet-visible absorption spectroscopic analysis (UV-Vis) and a photoelectron yield spectroscopic analysis (PYS).

As shown in FIG. 7, the nanographene polymer has a bandgap Eg of 2.1 eV (corresponding to the HOMO-LUMO energy level difference), and P3HT has a bandgap Eg of 2.2 eV. Thus, the bandgap Eg of the nanographene polymer is narrower than that of P3HT.

The nanographene polymer has a LUMO energy level of about −3.2 eV, which is deeper than that of P3HT (about −2.5 eV). Thus, the LUMO energy level of the nanographene polymer is closer to that of PCBM (a fullerene derivative) than that of P3HT. This is likely because the nanographene structural unit in the nanographene polymer is the condensed aromatic ring having an aromatic hydrocarbon ring as a basic skeleton, which is similar to the structure of PCBM. Therefore, in the BHJ solar cell 10 including the photoelectric conversion layer 16 having the nanographene polymer as a donor and the PCBM as an acceptor, the open circuit voltage Voc can be greater than that in a case of the layer having the P3HT as a donor.

The photoelectric conversion layer 16 containing the nanographene polymer can be formed as follows.

A mixture of the nanographene polymer and PCBM is added to an appropriate solvent such as toluene, chloroform, chlorobenzene, or the like. Alternatively, the nanographene polymer and PCBM may be separately added to the solvent. Since the nanographene polymer and PCBM are readily dissolved in the organic solvent, a mixture solution can be easily prepared.

The mixture solution is applied onto the hole transport layer 14 by a spin coating process, an ink-jet printing process, a roll casting process, a roll-to-roll process, or the like.

The applied mixture solution on the hole transport layer 14 is hardened under heating, whereby the photoelectric conversion layer 16 is formed. The photoelectric conversion layer 16 may be subjected to an annealing treatment if necessary. In the annealing treatment, the phase separation between the donor domain 26 and the acceptor domain 28 can be further improved, and the joint interface area between the donor domain 26 and the acceptor domain 28 can be increased to improve the power generation function.

In a case where a monomer is used as the donor, it is difficult to use the above process for forming the photoelectric conversion layer 16 because of the low solubility of the monomer in the organic solvent. In contrast, in this embodiment, the nanographene polymer having a soluble group is used as the donor as described above. Since the nanographene polymer is readily soluble in a predetermined solvent, the photoelectric conversion layer 16 can be simply formed with ease at low cost by the above process. Furthermore, the phase separation between the donor domain 26 and the acceptor domain 28 can be further facilitated. Thus, the donor domain 26 and the acceptor domain 28 can be desirably mixed, and the interface area can be increased. Consequently, the efficiency of charge separation into the electrons 36 and the holes 24 in the photoelectric conversion layer 16 can be improved, and the photoelectric power conversion efficiency of the BHJ solar cell 10 can be improved.

As described above, the nanographene polymer of this embodiment is the π-conjugated polymer having the widely spread π-electron cloud, and therefore has a high absorbance coefficient. Furthermore, the nanographene polymer can satisfactorily absorb the long-wavelength (near-infrared) light to improve the sunlight utilization efficiency. In addition, the nanographene polymer has a narrow bandgap Eg and a low HOMO energy level. Thus, the LUMO energy level of the nanographene polymer is close to that of PCBM.

Therefore, in the BHJ solar cell 10 using the nanographene polymer as the donor and the PCBM as the acceptor, the excitons 38 can be actively generated. Furthermore, the BHJ solar cell 10 can exhibit a high open circuit voltage Voc. Thus, the photoelectric power conversion efficiency can be improved suitably.

The present invention is not limited to the above embodiment, and various changes and modifications may be made therein without departing from the scope of the invention.

In the above embodiment, the nanographene polymer is derived from the polyphenylene having the $OC_{10}H_{21}$ groups in R1, R3, R4, and R6, the $C_{12}H_{25}$ groups in R7 and R8, and the $CH_3$ groups in R9 and R10 in the general formula (1). However, the alkoxy and alkyl groups in the polyphenylene are not limited thereto. In the general formula (1), at least one of R1 to R6 may be an alkoxy group, and each of R7 to R10 may be a hydrogen atom, an alkyl group, or an alkoxy group.

For example, the polyphenylene may have the $OC_{10}H_{21}$ groups in all of R1 to R6, the $C_{12}H_{25}$ groups in R7 and R8, and the $CH_3$ groups in R9 and R10 in the general formula (1), and the nanographene polymer may be derived from the polyphenylene. In this case, first, iodophenol is reacted with bromodecane to obtain 1-decyloxy-4-iodobenzene as shown in the following reaction formula (9).

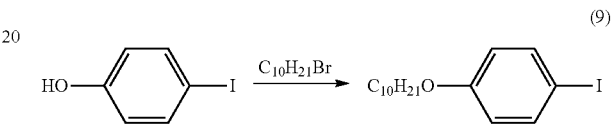
(9)

Then, 1-decyloxy-4-iodobenzene and 1,4-diethynylbenzene are reacted to obtain 1,4-bis(decyloxyphenylethynyl)benzene as shown in the following reaction formula (10).

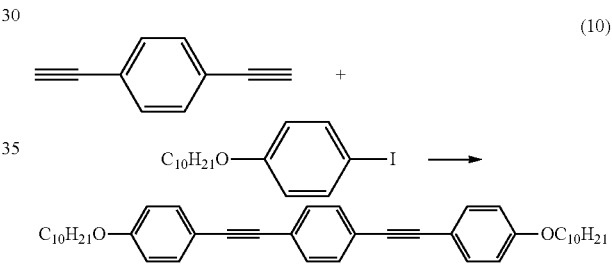
(10)

1,4-bis(decyloxyphenylethynyl)benzene is oxidized using a catalyst such as a palladium (Pd) complex to prepare an alkoxylated 1,4-bisbenzil as shown in the following reaction formula (11).

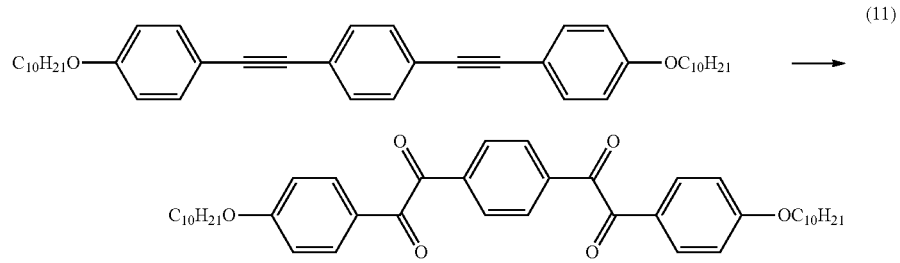
(11)

The alkoxylated 1,4-bisbenzil is reacted with the dibenzyl ketone having the alkoxy groups (i.e., 1,3-didecyloxybenzene-2-propanone) prepared as shown in the above reaction formula (5). Thus, a methanol solution of Triton B is added to a mixture solution containing the alkoxylated 1,4-bisbenzil, 1,3-didecyloxybenzene-2-propanone, and n-butanol under heating as shown in the following reaction formula (12).

(12)

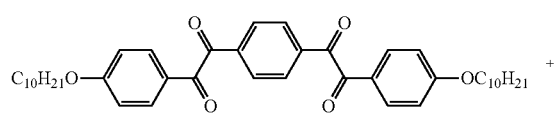

Triton B →

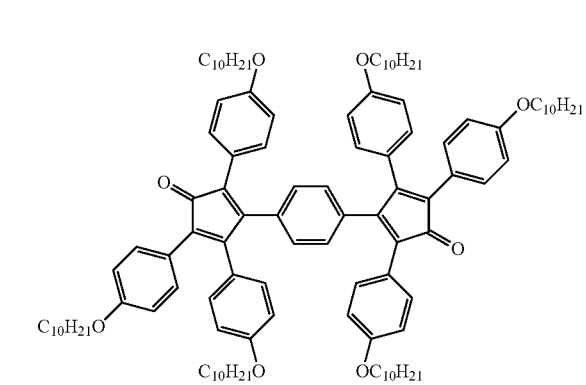

The resultant alkoxylated 3,3'-(1,4-phenylene)bis(2,4,5-triphenyl-2,4-cyclopentadiene-1-one) is subjected to a Diels-Alder polymerization reaction with 1,4-bis(1-propynyl)-2,5-didodecylbenzene in the same manner as the above 3,3'-(1,4-phenylene)bis(2,4,5-triphenyl-2,4-cyclopentadiene-1-one) prepared as shown in the reaction formula (6). As a result, the polyphenylene having the alkoxy groups in all of R1 to R6, the alkyl groups in R7 and R8, and the $CH_3$ groups in R9 and R10 in the general formula (1) is obtained.

As described above, the thus-obtained polyphenylene is reacted in the presence of a Lewis acid catalyst such as ferric chloride ($FeCl_3$) to produce the nanographene polymer having the structural unit represented by the general formula (2) or (3) with the $OC_{10}H_{21}$ groups in R1 to R6, the $C_{12}H_{25}$ groups in R7 and R8, and the $CH_3$ groups in R9 and R10.

In a case where all of R1 to R6 are the alkoxy groups and R7 and R8 are the alkyl groups in the general formula (1) as described above, a plurality of the structural units can be prevented more effectively from coming close to each other in the reaction of the polyphenylene. Thus, formation of the cross-linking in the nanographene polymer can be prevented more effectively. Consequently, the resultant nanographene polymer can have a higher affinity for the organic solvent, and thus can exhibit a higher solubility in the organic solvent.

The above embodiment is described with relation to the BHJ solar cell 10 having the photoelectric conversion layer 16 containing the mixture of the donor and the acceptor. However, the nanographene polymer (photoelectric conversion material) may be used in a planar heterojunction-type organic photovoltaic cell having a donor layer and an acceptor layer formed separately from each other. In this case, the nanographene polymer may be contained in the donor layer.

In the above embodiment, the nanographene polymer is used as the donor in the organic photovoltaic cell. The present invention is not particularly limited thereto, and the nanographene polymer may be used as the acceptor in the organic photovoltaic cell.

Furthermore, the use of the nanographene polymer is not limited to the use in the photoelectric conversion layer 16 in the organic photovoltaic cell. For example, the nanographene polymer may be used in an optical sensor.

Example 1

A BHJ solar cell was produced using a nanographene polymer as a donor and a PCBM as an acceptor in a photoelectric conversion layer.

Specifically, first, a glass substrate having a patterned ITO electrode was washed and fixed to a spin coater. Then, an aqueous PEDOT:PSS dispersion liquid was dropped onto the substrate, and the substrate was rotated at 4,000 rpm. As a result, a hole transport layer having a thickness of about 40 nm was formed.

Meanwhile, 4 mg of a nanographene polymer having the structural unit 30 shown in FIG. 3 and 16 mg of PCBM were dissolved in 1.0 ml of orthodichlorobenzene to prepare a mixture solution.

The substrate was fixed to the spin coater placed in a glove box, the mixture solution was dropped onto the hole transport layer, and the substrate was rotated at 1,000 rpm. As a result, a photoelectric conversion layer having a thickness of about 40 nm was formed.

The substrate having the hole transport layer and the photoelectric conversion layer was placed in a vacuum deposition apparatus. An electron transport layer containing bathocuproine, lithium fluoride, or the like was deposited on the photoelectric conversion layer, and an aluminum electrode having a thickness of 200 nm was further deposited on the electron transport layer, to produce the BHJ solar cell.

The power generation function of the BHJ solar cell was measured, and the measurement result is shown in FIG. 8. In the measurement, the BHJ solar cell was irradiated with a pseudo sunlight at AM 1.5 G (100 mW/cm$^2$) from a solar simulator equipped with an air mass filter. Specifically, in the BHJ solar cell, a current was measured under the above light irradiation while applying a voltage using a source meter unit (Keithley 2400). The short-circuit current density Isc (mA/cm$^2$), the open circuit voltage Voc (V), the fill factor FF, and the photoelectric power conversion efficiency (%) were obtained from the measurement result.

As shown in FIG. 8, the BHJ solar cell had a short-circuit current density Isc of 3.27 mA/cm$^2$, an open circuit voltage Voc of 0.80 V, a fill factor FF of 0.5, and a photoelectric power conversion efficiency of 1.3%.

As described above, it has been confirmed that the BHJ solar cell using the nanographene polymer of the present embodiment as the donor has a larger open circuit voltage Voc and a satisfactory photoelectric power conversion efficiency. Thus, the power generation function can be desirably improved.

What is claimed is:

1. A photoelectric conversion material that acts as an electron donor for donating an electron or an electron acceptor for accepting an electron, comprising:

a polymer obtained by reaction of a polyphenylene represented by the following general formula (1):

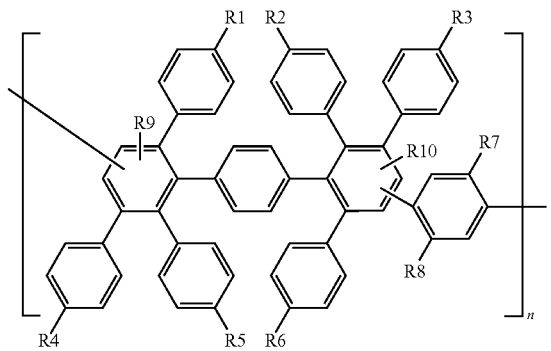

(1)

wherein at least one of R1 to R6 in the general formula (1) is an alkoxy group, and R7 to R10 independently represent a hydrogen atom, an alkyl group, or an alkoxy group, and n is the polymerization degree and has a value of 2 or more.

2. The photoelectric conversion material according to claim 1, wherein all of R1 to R10 in the general formula (1) are alkoxy groups.

3. The photoelectric conversion material according to claim 2, wherein R1 to R10 in the general formula (1) independently represent an alkoxy group having 1 to 20 carbon atoms.

4. The photoelectric conversion material according to claim 1, wherein the polymer has at least one structural unit selected from graphenes represented by the following general formulae (2) and (3):

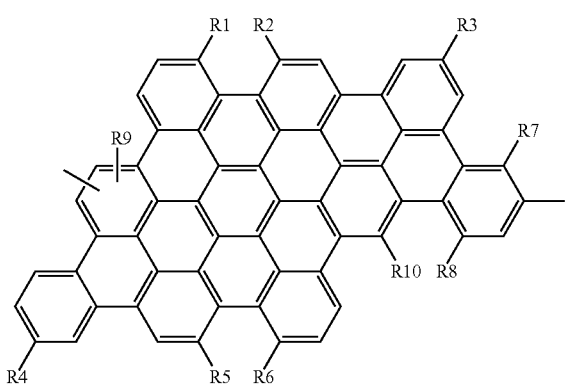

(2)

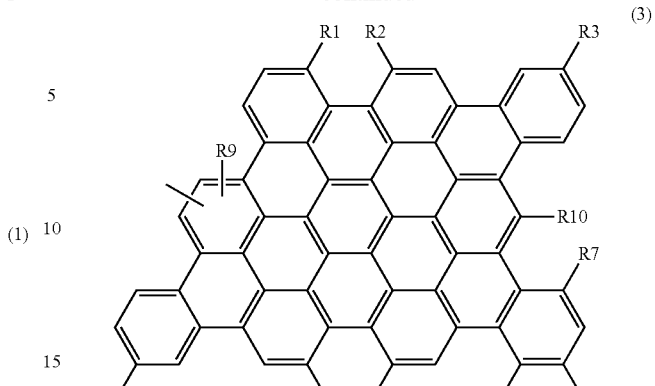

(3)

wherein at least one of R1 to R6 in each of the general formulae (2) and (3) is an alkoxy group, and R7 to R10 independently represent a hydrogen atom, an alkyl group, or an alkoxy group.

5. The photoelectric conversion material according to claim 1, wherein the polymer has a polymerization degree of 2 to 1,000.

6. The photoelectric conversion material according to claim 5, wherein the polymer has a molecular weight of 1,500 to 4,000,000.

7. A method for producing a photoelectric conversion material that acts as an electron donor for donating an electron or an electron acceptor for accepting an electron, comprising:
 polymerizing a phenylene derivative to prepare a polyphenylene; and
 reacting the polyphenylene to prepare a polymer as the photoelectric conversion material,
 the polyphenylene being represented by the following general formula (1):

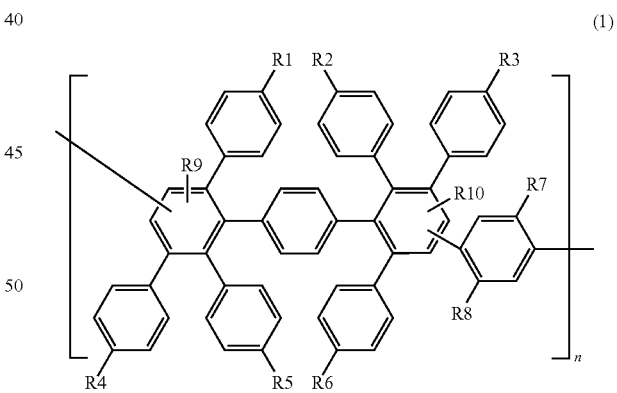

(1)

wherein at least one of R1 to R6 in the general formula (1) is an alkoxy group, and R7 to R10 independently represent a hydrogen atom, an alkyl group, or an alkoxy group, and n is the polymerization degree and has a value of 2 or more.

8. The method according to claim 7, wherein all of R1 to R10 in the general formula (1) are alkoxy groups.

9. The method according to claim 8, wherein R1 to R10 in the general formula (1) independently represent an alkoxy group having 1 to 20 carbon atoms.

10. The method according to claim 7, wherein the polymer has at least one structural unit selected from graphenes represented by the following general formulae (2) and (3):

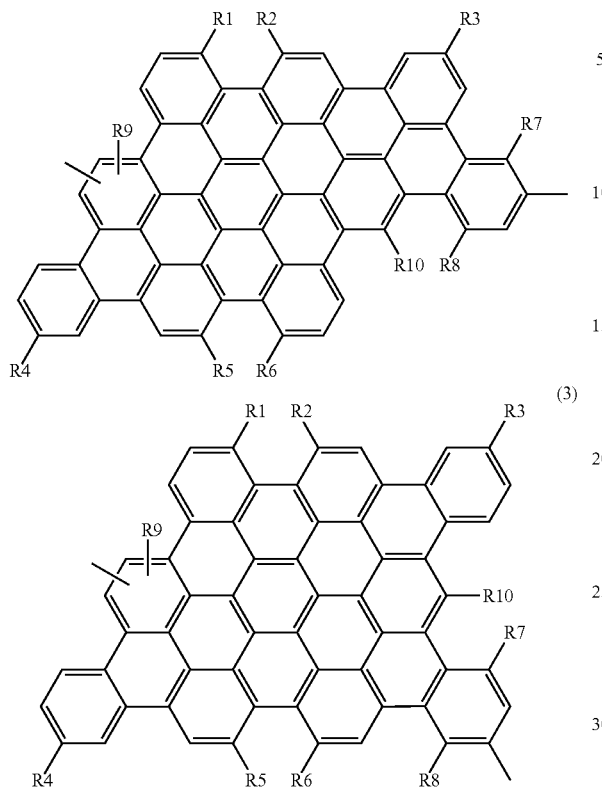

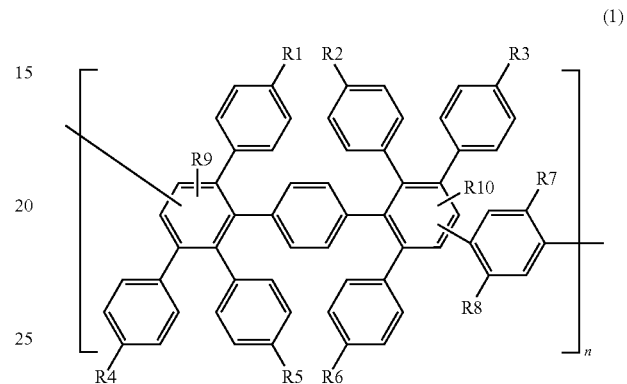

wherein at least one of R1 to R6 in each of the general formulae (2) and (3) is an alkoxy group, and R7 to R10 independently represent a hydrogen atom, an alkyl group, or an alkoxy group.

11. The method according to claim 7, wherein the polymer has a polymerization degree of 2 to 1,000.

12. An organic photovoltaic cell comprising a photoelectric conversion material that acts as an electron donor for donating an electron or an electron acceptor for accepting an electron, wherein
the organic photovoltaic cell has a photoelectric conversion layer, and
the photoelectric conversion layer contains, as an electron donor, the photoelectric conversion material containing a polymer obtained by reaction of a polyphenylene represented by the following general formula (1):

wherein at least one of R1 to R6 in the general formula (1) is an alkoxy group, and R7 to R10 independently represent a hydrogen atom, an alkyl group, or an alkoxy group, and n is the polymerization degree and has a value of 2 or more.

13. The organic photovoltaic cell according to claim 12, including a bulk heterojunction structure containing the photoelectric conversion layer wherein
the photoelectric conversion layer contains a mixture of the electron donor and an electron acceptor for accepting an electron released from the electron donor.

* * * * *